(12) United States Patent
Shibata

(10) Patent No.: US 9,306,140 B1
(45) Date of Patent: Apr. 5, 2016

(54) SEMICONDUCTOR LIGHT-EMITTING DEVICE

(71) Applicant: KABUSHIKI KAISHA TOSHIBA, Tokyo (JP)

(72) Inventor: Kyohei Shibata, Kanazawa Ishikawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/634,885

(22) Filed: Mar. 1, 2015

(30) Foreign Application Priority Data

Sep. 12, 2014 (JP) .................................. 2014-186899

(51) Int. Cl.
| | |
|---|---|
| *H01L 29/22* | (2006.01) |
| *H01L 33/62* | (2010.01) |
| *H01L 33/52* | (2010.01) |
| *H01L 33/50* | (2010.01) |
| *H01L 33/38* | (2010.01) |
| *H01L 33/48* | (2010.01) |

(52) U.S. Cl.
CPC ................ *H01L 33/62* (2013.01); *H01L 33/38* (2013.01); *H01L 33/486* (2013.01); *H01L 33/507* (2013.01); *H01L 33/52* (2013.01)

(58) Field of Classification Search
CPC ......... H01L 33/38; H01L 33/52; H01L 33/62; H01L 33/486; H01L 33/507
USPC ............................ 257/81, 84, 91, 98, 99, 100
See application file for complete search history.

(56) References Cited

U.S. PATENT DOCUMENTS

| | | | | |
|---|---|---|---|---|
| 6,921,928 | B2 * | 7/2005 | Sonobe | 257/99 |
| 8,643,048 | B2 | 2/2014 | Hwang | |
| 8,835,951 | B2 * | 9/2014 | Ichikawa | 257/98 |
| 2002/0041148 | A1 | 4/2002 | Cho et al. | |
| 2010/0078659 | A1 * | 4/2010 | Iizuka et al. | 257/94 |
| 2012/0223356 | A1 | 9/2012 | Suzuki | |

FOREIGN PATENT DOCUMENTS

JP 2012-186199 A 9/2012

* cited by examiner

*Primary Examiner* — Hung Vu
(74) *Attorney, Agent, or Firm* — Patterson & Sheridan, LLP

(57) ABSTRACT

A semiconductor light-emitting device includes first and second semiconductor layer and a light-emitting layer between the first and second semiconductor layers. These layers are on a conductive substrate. A first electrode and a first electrode pad, which are electrically connected to each other, are the first semiconductor layer. A second electrode is between the substrate and the second semiconductor layer. A portion of the second electrode is not covered by the first semiconductor, second semiconductor, and light-emitting layers. A second electrode pad is on the exposed portion of the second electrode. The second electrode pad has a planar area that is less than a planar area of the first electrode pad. A third electrode is on a second surface of the conductive substrate such that the conductive substrate is between the third electrode and the second electrode. The third electrode is electrically connected to the second electrode pad.

16 Claims, 3 Drawing Sheets

A-A'

B-B'

SEMICONDUCTOR LIGHT-EMITTING DEVICE

CROSS-REFERENCE TO RELATED APPLICATION

This application is based upon and claims the benefit of priority from Japanese Patent Application No. 2014-186899, filed Sep. 12, 2014, the entire contents of which are incorporated herein by reference.

FIELD

Embodiments described herein relate generally to a semiconductor light-emitting device.

BACKGROUND

In a device including a light-emitting element that has a structure in which an electrode pad for wire bonding is provided in a region separate from a light-emitting layer surface, the space available for a light-emitting region becomes smaller as much as of the device area is occupied by the electrode pad. For this reason, an effective utilization of the light-emitting region is desired as a measure to improve an optical output.

DETAILED DESCRIPTION

Figure 1A:
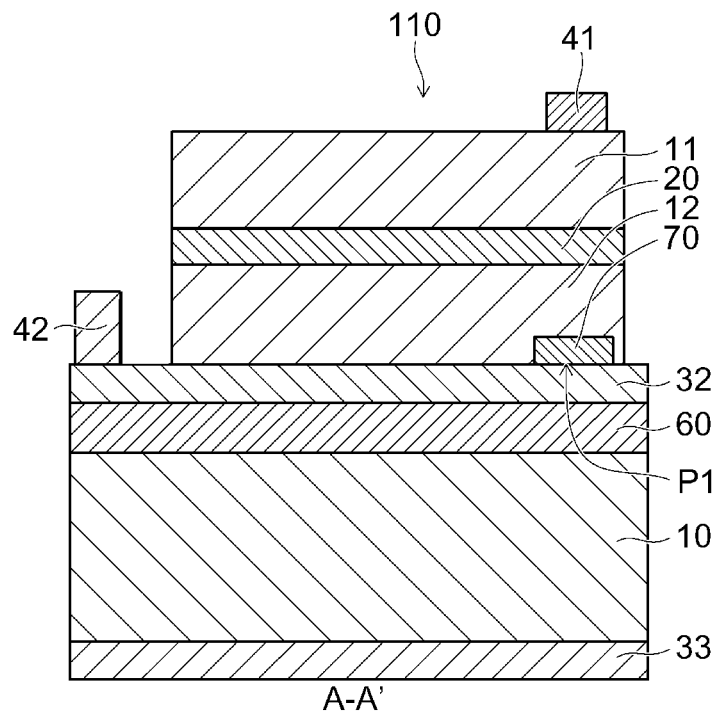
FIGS. 1A and 1B are schematic cross-sectional views illustrating a semiconductor light-emitting device according to a first embodiment.

According to an embodiment, a semiconductor light-emitting device, comprises a first semiconductor layer. A second semiconductor layer is between the first semiconductor layer and a conductive substrate. A light-emitting layer is between the first semiconductor layer and the second semiconductor layer. A first electrode is on a first surface of the first semiconductor layer. The first semiconductor layer is between the first electrode and the light-emitting layer. A first electrode pad is on the first surface and electrically connected to the first electrode. A second electrode is between the substrate and the second semiconductor layer. A portion of the second electrode is not covered by the second semiconductor layer, the light-emitting layer, and the first semiconductor layer. A second electrode pad is on the uncovered portion of the second electrode and is electrically connected to the second electrode. The second electrode pad has an area in a first plane that is parallel to the conductive substrate which is less than an area of the first electrode pad in a second plane that is parallel to the first plane. A third electrode is on a second surface of the conductive substrate such that the conductive substrate is between the third electrode and the second electrode. The third electrode is electrically connected to the second electrode pad.

In general, according to another embodiment, a semiconductor light-emitting device includes: a conductive substrate; a first semiconductor layer; a second semiconductor layer that is provided between the substrate and the first semiconductor layer; a light-emitting layer that is provided between the first semiconductor layer and the second semiconductor layer; a first electrode that is provided on a front surface of the first semiconductor layer opposite to the light-emitting layer; a first electrode pad that is provided on the front surface of the first semiconductor layer and is connected to the first electrode; a second electrode; a second electrode pad; and a third electrode. The second electrode is provided between the substrate and the second semiconductor layer and has a region that is not covered with the second semiconductor layer, the light-emitting layer, and the first semiconductor layer. The second electrode pad is provided in the region of the second electrode, is connected to the second electrode, and has an area smaller than an area of the first electrode pad. The third electrode is provided on a front surface of the substrate opposite to the second electrode.

Hereinafter, with reference to the drawings, example embodiments will be described. In addition, in each drawing, the same structural elements will be given the same reference numerals.

Figure 1B:
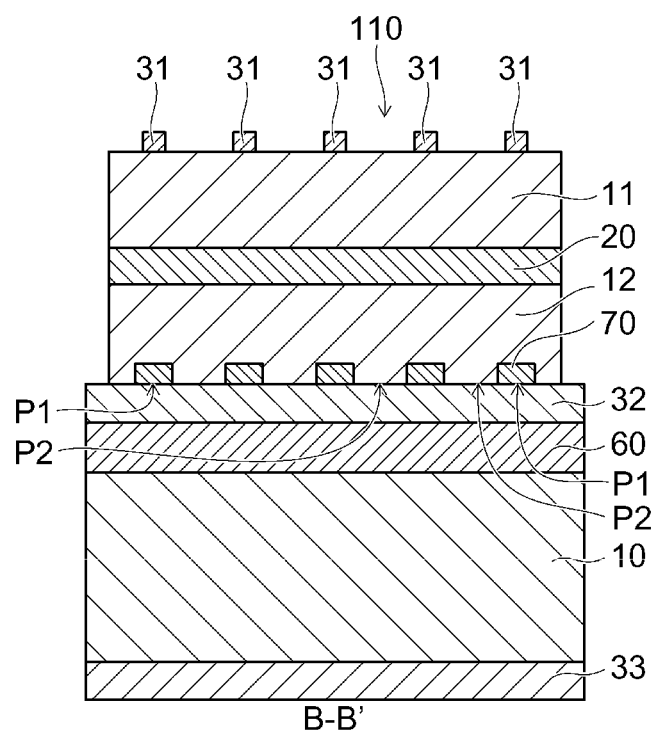

FIGS. 1A and 1B are schematic cross-sectional views of the semiconductor light-emitting device of an embodiment.

Figure 2:
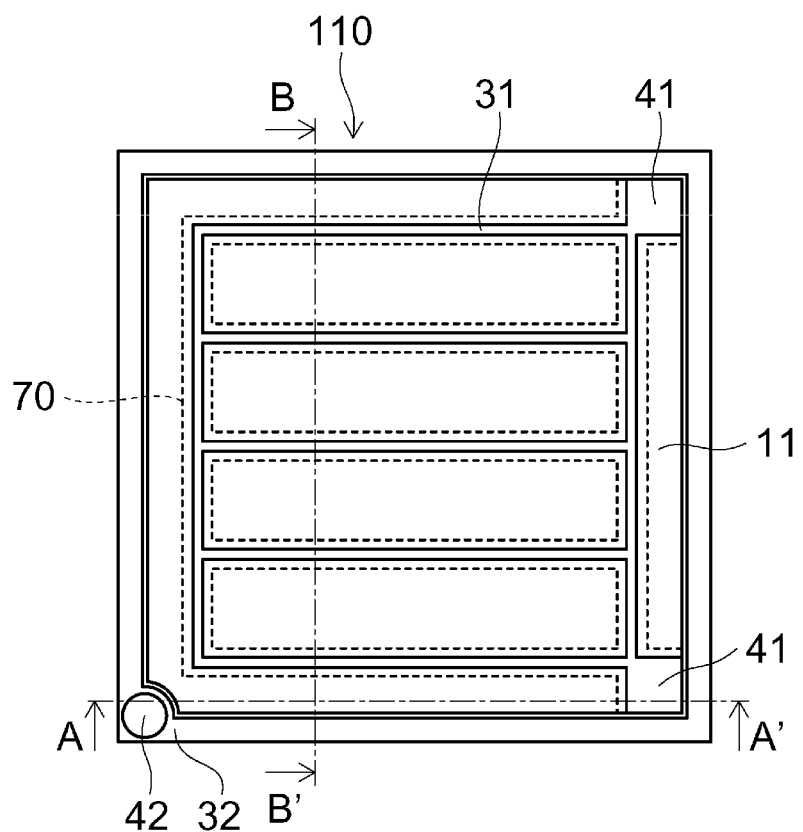
FIG. 2 is a schematic plan view illustrating the semiconductor light-emitting device according to the first embodiment.

FIG. 2 is a schematic plan view of the semiconductor light-emitting device of the embodiment. In addition, FIG. 1A illustrates a cross-sectional view taken along A-A' in FIG. 2. FIG. 1B is a cross-sectional view taken along B-B' in FIG. 2.

The semiconductor light-emitting device according to the embodiment includes a semiconductor chip 110. The semiconductor chip 110 includes a substrate 10, a first semiconductor layer 11, a second semiconductor layer 12, a light-emitting layer 20, a first electrode 31, a second electrode 32, a third electrode 33, a first electrode pad 41, and a second electrode pad 42.

The substrate 10 has conductivity. The substrate 10 is, for example, a silicon substrate which is doped by impurities. On the substrate 10, the first semiconductor layer 11 is provided. The second semiconductor layer 12 is provided between the substrate 10 and the first semiconductor layer 11. The light-emitting layer 20 is provided between the first semiconductor layer 11 and the second semiconductor layer 12. The first semiconductor layer 11, the second semiconductor layer 12, and the light-emitting layer 20 include a nitride semiconductor, for example. For example, the first semiconductor layer 11 includes an n-type GaN, and the second semiconductor layer 12 includes a p-type GaN. The light-emitting layer 20 includes a material which emits light, such as blue light, violet light, blue-violet light, or ultraviolet light. A light-emitting peak wavelength of the light-emitting layer 20 is 430 nm to 470 nm, for example.

On a front surface of the first semiconductor layer 11, opposite to the light-emitting layer 20, the first electrode 31 (see FIG. 1B and FIG. 2) and the first electrode pad 41 (see FIG. 1A and FIG. 2) are respectively provided. The first electrode pad 41 may be electrically connected to the outside of the semiconductor chip 110. The first electrode 31 is, for example, an n-side electrode, and is electrically connected to a cathode terminal of an outer circuit.

As illustrated in FIG. 2, the first electrode 31 and the first electrode pad 41 are provided on the first semiconductor layer 11. The first electrode 31 is connected to the first electrode pad 41, and extends in plural directions on an upper surface of the first semiconductor layer 11. The extending direction and the number of the first electrodes 31 are arbitrary.

As illustrated in FIGS. 1A and 1B, the second electrode is provided between the substrate 10 and the second semiconductor layer 12. The second electrode 32 is in contact with the second semiconductor layer 12, and is electrically connected to the second semiconductor layer 12. The second electrode 32 is electrically connected to the substrate 10. The second electrode 32 is, for example, a p-side electrode, and is electrically connected to an anode terminal of the outer circuit.

The second electrode 32 has a region which is not covered by the second semiconductor layer 12, the light-emitting layer 20, and/or the first semiconductor layer 11. In this region, the second electrode pad 42 is provided. The second electrode pad 42 is electrically connected to the second electrode 32. The second electrode pad 42 may be electrically connected to the outside of the semiconductor chip 110.

As illustrated in FIG. 2, a planar outer shape of the semiconductor chip 110 is, for example, a rectangle, and the second electrode pad 42 is provided on a corner (end part of an upper surface of the semiconductor chip 110) of the rectangle. An area of the second electrode pad 42 is smaller than an area of the first electrode pad 41. Here, the "area" means an occupied area as viewed from a direction from the first semiconductor layer 11 toward the second semiconductor layer 12 (e.g., when viewed in planar view as in FIG. 2).

As illustrated in FIGS. 1A and 1B, on the front surface of the substrate 10 opposite to the second electrode 32, the third electrode 33 is provided. Similarly to the second electrode 32, the third electrode 33 is, for example, a p-side electrode, and is electrically connected to the anode terminal of the outer circuit.

The third electrode 33 is electrically connected to each of the second semiconductor layer 12 and the second electrode pad 42 via the substrate 10, a bonding metal 60, and the second electrode 32. The third electrode 33 may be electrically connected to the outside of the semiconductor chip 110. The second semiconductor layer 12 may be electrically connected to the outside through at least any of the second electrode pad 42 and the third electrode 33.

When the semiconductor chip is mounted, the first electrode pad 41 is connected to the cathode terminal, and the third electrode 33 is connected to the anode terminal. In addition, the second electrode pad 42 is used as a measurement terminal for inspecting (testing) characteristics of the device. By supplying a current to the light-emitting layer 20 through a measuring probe, which is brought into contact with the first electrode pad 41, and a measuring probe, which is brought into contact with the second electrode pad 42, and by emitting the light from the light-emitting layer 20, inspections are performed. When probes are brought into contact with the pads 41 and 42 on the same surface side, it is possible to shorten the time required for inspection by 1/10 to 1/3, as compared to a case where the test probes are brought into contact with the pads 41 and third electrode 33, respectively on front and rear surfaces of the semiconductor chip 110.

When the device is in actual use, the current is supplied to the light-emitting layer 20 through the first electrode pad 41 and the third electrode 33 and wire bonding to the second electrode pad 42 is not performed. Owing to this, the area of the second electrode pad 42 may be reduced to a minimum size for which the characteristics inspection using the probe is possible. That is, the area of the second electrode pad 42 may be the smallest area for which the test probe can successfully address. For this reason, it is possible to significantly reduce the area of the second electrode pad 42 than in a case where the second electrode pad 42 is used as a wire bonding pad.

In a wire bonding pad, a certain area for wire) bonding with an appropriate bonding strength and a bonding area is required. The bonding wire may be, for example, a gold (Au) wire or the like. When the final chip size is to be the same, if the area of the bonding pad in a region where the light-emitting layer 20 does not exist increases, the area of the light-emitting layer 20 relatively decreases, and an optical output is comparatively reduced.

In contrast, according to the first embodiment, the area for measuring of the second electrode pad 42 may be reduced. Owing to this, it is possible to effectively utilize the light-emitting region, and to enlarge the area of the light-emitting layer 20 to be more closely equal to the size of the area of the semiconductor chip 110. In other words, it is possible to achieve a higher optical output.

In addition, by providing the second electrode pad 42 as a pad for characteristics inspection, it is possible to significantly reduce the time required for the characteristics inspection. For example, the characteristics inspection can be performed by using the first electrode pad 41 and the third electrode 33. At this time, each of the first electrode pad 41 and the third electrode 33 provided on a surface in mutually opposite directions. For this reason, when the characteristic inspection is performed, an operation, such as moving the semiconductor chip 110, may be a reason of a waste of time it may be required to handle each chip from a wafer individually.

In contrast, according to the first embodiment, the characteristics inspection is performed by using the first electrode pad 41 and the second electrode pad 42. Since each of the first electrode pad 41 and the second electrode pad 42 is provided on a surface in the same direction, it is possible to perform the characteristics inspection during a shorter period of time.

Between the substrate 10 and the second electrode 32, for example, the bonding metal (metal layer) 60 is provided. The bonding metal 60 is electrically connected to each of the substrate 10 and the second electrode 32. Owing to this, even when the above-described second electrode pad 42 is provided and the area of the light-emitting layer 20 is expanded, it is possible to uniformly supply the current to the second electrode 32 via the bonding metal 60, and to improve optical characteristics.

Between the second semiconductor layer 12 and the second electrode 32, a high resistance region 70 (current blocking region) is provided. For example, as a front surface of the second semiconductor layer 12 is oxidized, the high resistance region 70 is formed. Resistance of the high resistance region 70 is higher than resistance of the second semiconductor layer 12. In other words, in the high resistance region 70, it is more difficult for current to flow than in the second semiconductor layer 12.

Here, when viewed from the first semiconductor layer 11 in a direction to the substrate 10, a part in which each of the first electrode 31 and the first electrode pad 41 is overlapped with the front surface of the second semiconductor layer 12 is a first region P1. A part in which each of the first electrode 31 and the first electrode pad 41 is not overlapped with the front surface of the second semiconductor layer 12 is a second region P2. The high resistance region 70 is provided to be in contact with the entire first region P1 and a part of the second region P2.

For example, the light which is released from the light-emitting layer 20 may be taken out to the outside via the first semiconductor layer 11. In contrast, each of the first electrode 31 and the first electrode pad 41 does not allow the light to go through (may be substantially opaque to the emitted light). For this reason, it is not possible to take out the light which is released toward each of the first electrode 31 and the first electrode pad 41 to the outside.

According to the first embodiment, the high resistance region 70 is provided on the first region P1. Owing to this, it is possible to restrict the current which is supplied to the second semiconductor layer 12 on the high resistance region 70. For this reason, it is possible to suppress the light which is released toward each of the first electrode 31 and the first electrode pad 41.

In addition to the description above, on the second region P2 in which the high resistance region 70 is not provided, the current which is supplied to the second semiconductor layer 12 increases. For this reason, a ratio of the emitted light in the region in which the first electrode 31 and the first electrode pad 41 are not provided may be increased, and extraction efficiency of the light which is released from the light-emitting layer 20 may be improved. Owing to this, even when the above-described second electrode pad 42 is provided and the number of first electrodes 31 increases according to the expansion of the area or the light-emitting layer 20, it is possible to suppress deterioration of taking-out efficiency of the light.

Furthermore, by adding the high resistance region 70 to the first region P1 and widening the second region P2, it is possible to allow the current which contributes to light-emitting to be more uniformly spread. Owing to this, it is possible to further suppress the light which is released toward each of the first electrode 31 and the first electrode pad 41, and to improve extraction efficiency of the light.

For example, as illustrated in FIG. 2, the high resistance region 70 is provided at a width which is 20 μm larger than a width of the first region P1. In other words, the width of the high resistance region 70 is larger by 20 μm than width of each of the first electrode 31 and the first electrode pad 41. Owing to this, it is possible to improve optical characteristics without increasing an operating voltage.

Thus, according to the first embodiment, it is possible to more effectively utilize the light-emitting region, and to provide a semiconductor light-emitting device which has a high optical output.

Figure 3A:
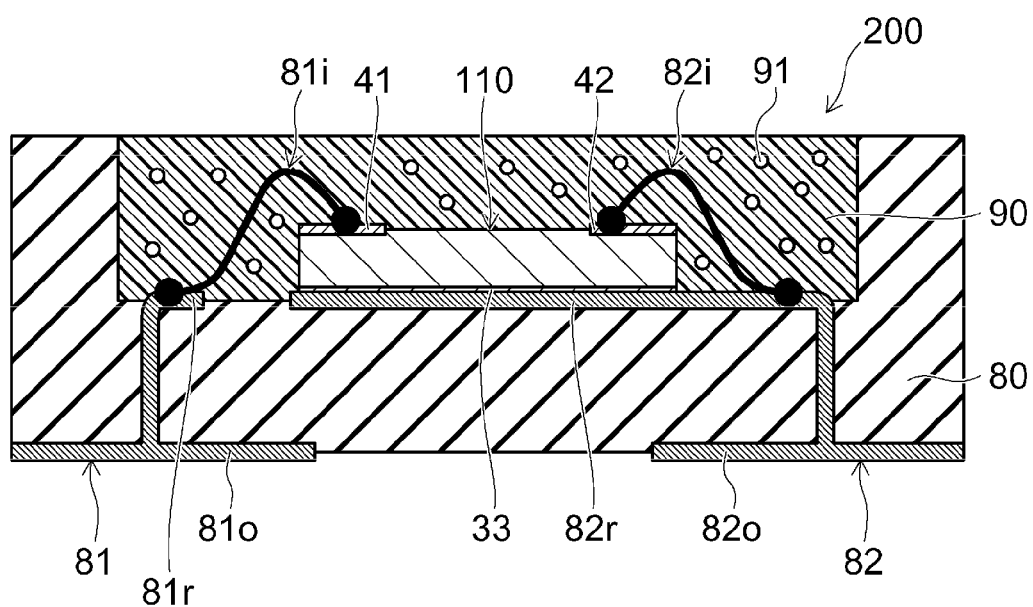
FIGS. 3A and 3B are schematic cross-sectional views illustrating a semiconductor light-emitting device according to another embodiment.
Figure 3B:
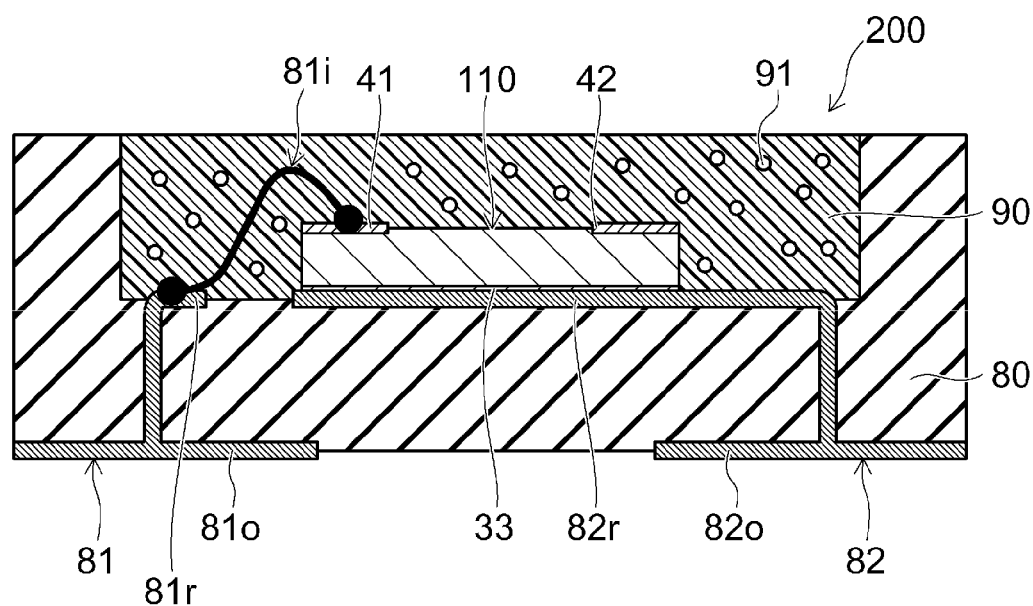

FIGS. 3A and 3B are schematic cross-sectional views illustrating a semiconductor light-emitting device according to another embodiment (a second embodiment).

A semiconductor light-emitting device 200 includes the semiconductor chip 110, a supporting body 80, and a resin layer 90. Since the semiconductor chip 110 is similar to that in the above-described embodiment, the description thereof will be omitted.

The supporting body 80 is provided to surround a lower surface and a side surface of the semiconductor chip 110. The supporting body 80 includes lead units 81 and 82 (a second lead and a first lead).

The resin layer 90 is provided between a side surface of the semiconductor chip 110 and the supporting body 80. The resin layer 90 covers the side surface and an upper surface of the semiconductor chip 110 (the first semiconductor layer 11, the second semiconductor layer 12, and the light-emitting layer 20). The resin layer 90 is surrounded by the supporting body 80. In the resin layer 90, a fluorescent material 91 is dispersed, for example. Fluorescent material 91 comprises particles, for example, which absorb light at a wavelength of light emitted by semiconductor chip 110 and emits a light at a wavelength different from the absorbed wavelength.

As illustrated in FIG. 3B, the lead units 81 and 82 respectively include inner lead units 81r and 82r, and outer lead units 81o and 82o. The inner lead unit 81r is electrically connected to the first electrode pad 41 via a wire 81i (first wire). The inner lead unit 82r is electrically connected to the third electrode 33 of the semiconductor chip 110.

Owing to this, similarly to the first embodiment, it is possible to use the second electrode pad 42 for the characteristics inspection (testing), and to more easily and quickly perform the characteristics inspection. In addition to this, it is possible to form the area of the second electrode pad 42 to be small, and thus to allow the area of the light-emitting layer 20 to be larger. The entire front surface of the second electrode pad 42 is covered by the resin layer 90 without performing wire bonding to the second electrode pad 42. Owing to this, it is possible to prevent deterioration of the optical characteristics which may otherwise be caused by the second electrode pad 42 and bonding wires thereto, which is not necessary according to this embodiment.

Otherwise, as illustrated in FIG. 3A, the lead unit 82 is electrically connected to the second electrode pad 42 via a wire 82i (second wire), for example. At this time, the third electrode 33 does not need to be electrically connected to the inner lead unit 82r. In other words, the lead unit 82 may be electrically connected to at least any of the second electrode pad 42 and the third electrode 33, and one may arbitrarily select a connection location according to design requirements. Even when the connection location is arbitrarily selected, similarly to the first embodiment, it is possible to achieve a high optical output.

Two or more second electrode pads 42 of the semiconductor chip 110 may be provided. At this time, as illustrated in FIG. 3A, one second electrode pad 42 is electrically connected to the lead unit 82 via the wire 82i. In contrast, as illustrated in FIG. 3B, another second electrode pad 42 (second electrode terminal) is not connected to the wire 82i, and is completely covered by the resin layer 90. Owing to this, before forming the resin layer 90, in a state where one second electrode pad 42 and the wire 82i are formed, it is possible to easily perform the characteristics inspection.

According to the second embodiment, the resin layer 90 is provided, and in the resin layer 90, the fluorescent material 91 is provided. Owing to this, even when the second electrode pad 42 is provided as described and the area of the light-emitting layer 20 is expanded, it is possible to reduce chromaticity variation of the light emitted from semiconductor light-emitting device 200.

As above, according to the second embodiment, it is possible to effectively utilize the light-emitting region, and to provide a semiconductor light-emitting device which achieves a high optical output.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor light-emitting device, comprising:
a first semiconductor layer;
a second semiconductor layer between the first semiconductor layer and a conductive substrate;
a light-emitting layer between the first semiconductor layer and the second semiconductor layer;
a first electrode on a first surface of the first semiconductor layer, the first semiconductor layer being between the first electrode and the light-emitting layer;
a first electrode pad on the first surface and electrically connected to the first electrode;

a second electrode between the substrate and the second semiconductor layer, a portion of the second electrode not covered by the second semiconductor layer, the light-emitting layer, and the first semiconductor layer;

a second electrode pad on the portion of the second electrode and electrically connected to the second electrode, the second electrode pad having an area in a first plane parallel to the conductive substrate that is less than an area of the first electrode pad in a second plane parallel to the first plane; and a third electrode on a second surface of the conductive substrate such that the conductive substrate is between the third electrode and the second electrode, the third electrode being electrically connected to the second electrode pad.

2. The semiconductor light-emitting device according to claim 1, further comprising:

a metal layer between the conductive substrate and the second electrode.

3. The semiconductor light-emitting device according to claim 1, further comprising:

a high resistance region between the second electrode and a first region of the second semiconductor layer in which the first electrode and the first electrode pad are overlapped with each other when viewed from a first direction from the first semiconductor layer toward the conductive substrate, the first direction being substantially orthogonal to first plane, the high resistance region having an electrical resistance that is greater than an electrical resistance of the second semiconductor layer.

4. The semiconductor light-emitting device according to claim 3, wherein a first width, in a first direction that is parallel to the first plane, of the high resistance region is greater than a width of the first electrode in the first direction, and a second width, in a second direction parallel to the first plane and crossing the first direction, of the high resistance region is greater than a width of the first electrode pad in the second direction.

5. The semiconductor light-emitting device according to claim 1, further comprising:

a supporting body on which the conductive substrate is disposed;

a first lead in the supporting body and bonded to the third electrode;

a second lead separated from the first lead and in the supporting body; and a first wire connecting the first electrode pad and the second lead.

6. The semiconductor light-emitting device according to claim 5, further comprising:

a resin layer disposed on the supporting body and covering the first semiconductor layer, the light-emitting layer, and the second semiconductor layer.

7. The semiconductor light-emitting device according to claim 6, wherein the second electrode pad is not bonded to a wire, and a surface of the second electrode pad opposite the second electrode is covered by the resin layer.

8. The semiconductor light-emitting device according to claim 6, further comprising:

a fluorescent material dispersed in the resin layer.

9. The semiconductor light-emitting device according to claim 5, further comprising:

a second wire connecting the second electrode pad and the first lead.

10. A light-emitting device, comprising:

a light emitting element having a first surface at which a first semiconductor layer of a first conductivity type is disposed and a second surface opposite the first surface, a second semiconductor layer of a second conductivity type being disposed at the second surface;

a first electrode contacting the first surface;

a second electrode including a first portion contacting the second surface and a second portion which extends beyond the second surface in a first direction parallel to a plane of the second surface;

a first electrode pad electrically connected to the first electrode and disposed on the first surface; and a second electrode pad electrically connected to the second electrode and disposed on the second portion, the second electrode pad being spaced along the first direction from the light emitting element, wherein the second electrode pad has an area within a second plane, which is parallel to the plane of the second surface, that is less than an area of the first electrode pad within a third plane that is parallel to the second plane.

11. The light-emitting device of claim 10, further comprising:

a substrate contacting the second electrode such that the second electrode is between the substrate and the light emitting element; and a third electrode disposed on the substrate such that the substrate is between the second electrode and the third electrode.

12. The light-emitting device of claim 11, wherein the substrate is silicon.

13. The light-emitting device of claim 11, wherein the third electrode is electrically connected to the second electrode pad.

14. The light-emitting device of claim 11, wherein the substrate is disposed on a third surface of a support body, the support body having a fourth surface opposite the third surface, the support body includes first and second leads disposed therein that extend from the third surface to the fourth surface, and the support body has a portion which extends from the third surface and surrounds the light emitting element in a third plane parallel to the third surface.

15. The light-emitting device of claim 14, further comprising:

a resin layer disposed on the support body and covering the light emitting element and including fluorescent material dispersed therein.

16. The light-emitting device of claim 10, further comprising:

a resin layer on the light emitting element and including fluorescent material dispersed therein.

* * * * *